(12) United States Patent
Furuhata

(10) Patent No.: US 7,163,861 B2
(45) Date of Patent: *Jan. 16, 2007

(54) SEMICONDUCTOR DEVICES, METHODS OF MANUFACTURING SEMICONDUCTOR DEVICES, CIRCUIT SUBSTRATES AND ELECTRONIC DEVICES

(75) Inventor: Tomoyuki Furuhata, Sakata (JP)

(73) Assignee: Seiko Epson Corporation, Tokyo (JP)

(*) Notice: Subject to any disclaimer, the term of this patent is extended or adjusted under 35 U.S.C. 154(b) by 167 days.

This patent is subject to a terminal disclaimer.

(21) Appl. No.: 10/909,685

(22) Filed: Aug. 2, 2004

(65) Prior Publication Data

US 2005/0003615 A1    Jan. 6, 2005

Related U.S. Application Data

(62) Division of application No. 09/459,305, filed on Dec. 10, 1999, now Pat. No. 6,800,894.

(30) Foreign Application Priority Data

Dec. 11, 1998  (JP) .................................. 10-352498
Aug. 26, 1999  (JP) .................................. 11-239380

(51) Int. Cl.
   *H01L 21/336*   (2006.01)
(52) U.S. Cl. ...................... 438/257; 438/279
(58) Field of Classification Search ................ 438/257, 438/261, 264, 279, 280, 281, 306
   See application file for complete search history.

(56) References Cited

U.S. PATENT DOCUMENTS

| 5,297,082 A | 3/1994 | Lee ............................. 365/185 |
| 5,326,999 A | 7/1994 | Kim et al. ................... 275/315 |
| 5,394,001 A | 2/1995 | Yamaguchi et al. ........ 257/315 |
| 5,445,981 A * | 8/1995 | Lee ............................. 438/257 |
| 5,523,249 A | 6/1996 | Gill et al. ................... 438/263 |
| 5,553,018 A | 9/1996 | Wang et al. ............ 365/185.01 |
| 5,568,422 A | 10/1996 | Fujiwara ................ 365/185.33 |

(Continued)

FOREIGN PATENT DOCUMENTS

| JP | 03-211774 | 9/1991 |
| JP | 04-087375 | 3/1992 |
| JP | 06-196712 | 7/1994 |

OTHER PUBLICATIONS

U.S. Appl. No. 09/155,357

(Continued)

*Primary Examiner*—Tuan H. Nguyen
(74) *Attorney, Agent, or Firm*—Konrad Raynes & Victor, LLP; Alan S. Raynes

(57) ABSTRACT

Certain embodiments include a semiconductor device capable of preventing a retardation of signal transmission between the smallest units, a method for the manufacture thereof, a circuit substrate and an electronic device. Embodiments also include a manufacturing method comprising a laminating step of forming tunnel insulating films 12 and 22, floating gates 14 and 24, dielectric films 16 and 26, control gates 18 and 28 on first and second memory cell areas 10 and 20 formed mutually adjacent to each other on a semiconductor substrate 30, a plurality of impurity area formation steps of forming sources and drains 32, 34, 36 and 38 on the first and second memory cell areas 10 and 20, and forming a connecting area 40 capable of forming an electric connection between one 32 of the source and drain of the first memory cell area 10 and one 36 of the source and drain of the second memory cell area 20. The connecting area 40 is formed to have a lower electric resistance than impurity areas 42 and 44 formed in one of the of impurity area formation steps.

21 Claims, 7 Drawing Sheets

U.S. PATENT DOCUMENTS

| | | | |
|---|---|---|---|
| 5,661,057 A | * 8/1997 | Fujiwara | 438/257 |
| 5,675,161 A | 10/1997 | Thomas | 257/316 |
| 5,780,341 A | 7/1998 | Ogura | 438/259 |
| 6,015,725 A | 1/2000 | Hirayama | 438/156 |
| 6,027,971 A | 2/2000 | Cho et al. | 438/257 |
| 6,137,134 A | * 10/2000 | Nakagawa | 257/316 |
| 6,320,218 B1 | * 11/2001 | Furuhata | 257/318 |
| 6,337,250 B1 | 1/2002 | Furuhata | 438/301 |

OTHER PUBLICATIONS

U.S. Appl. No. 09/273,500.

Examination Result from Japanese Patent Office for Japanese Patent Application No. 11-239380, dated Dec. 28, 2004.

* cited by examiner

SEMICONDUCTOR DEVICES, METHODS OF MANUFACTURING SEMICONDUCTOR DEVICES, CIRCUIT SUBSTRATES AND ELECTRONIC DEVICES

This is a divisional of U.S. application Ser. No. 09/459,305, filed Dec. 10, 1999,now U.S. Pat. No. 6,800,894 which is hereby incorporated by reference in its entirety.

FIELD OF THE INVENTION

The present invention relates to semiconductor devices, and methods of manufacturing semiconductor devices, including various circuits and electronic devices.

BACKGROUND

As a semiconductor device, there has been widely used a memory such as a flash memory which is comprised of floating gate and control gate. A memory cell serving as a smallest unit may include a tunnel oxide film (a first insulating film) formed by oxidizing the surface of a semiconductor substrate, a floating gate (a first poly-silicon film) formed on the tunnel oxide film, a dielectric film (a second insulating film) formed on the floating gate, and a control gate (a second poly-silicon film) formed on the dielectric film. Further, a semiconductor substrate is formed with a source area and a drain area under the tunnel oxide film, and the two areas are located on such positions that the floating gate is interposed therebetween. One (a first impurity area) of the source area and the drain area is connected through a connecting area (a third impurity area) to one (a second impurity area) of the source area and the drain area of an adjacent area.

Here, there is a problem that can be described as follows, i.e., if the third impurity area is formed at the same time as the above first and second impurity areas in accordance with a depth and a impurity concentration required by the first and second impurity areas, the resistance of the connecting area (the third impurity area) will become high, hence retarding the transmission of a signal.

SUMMARY

Certain embodiments relate to a method of manufacturing a semiconductor device, including a laminating step including forming tunnel insulating films, floating gates, dielectric films and control gates on first and second cell areas, the first and second cell areas being formed mutually adjacent to each other on a semiconductor substrate. A plurality of impurity area formation steps are carried out for forming sources and drains on the first and second cell areas. The method also includes forming an electric connection between one of the source and drain of the first cell area and one of the source and drain of the second cell area. The electrical connection may flow through a connecting area formed to have a lower electric resistance than impurity areas formed in one of the plurality of impurity area formation steps.

Other embodiments relate to a semiconductor device including tunnel insulating films, floating gates, dielectric films and control gates, all of which are formed on first and second cell areas on a semiconductor substrate. Sources and drains are formed on the first and second cell areas, and a connecting area is formed that is capable of electrically connecting one of the source and drain of the first cell area with one of the source and drain of the second cell area. The connecting area is formed to have an electric resistance which is lower than any one of the sources and drains of the first and second cell areas.

Other embodiments relate to a method for manufacturing a semiconductor device, including forming first and second field effect transistors, each having source/drain regions, and forming a conducting region connecting a source/drain region of the first field effect transistor to a source/drain region of the second field effect transistor, wherein the conducting region is formed to have a lower resistance than at least one of the source/drain regions.

Other embodiments relate to a semiconductor device including first and second field effect transistors, each having source/drain regions, and a conducting region connecting a source/drain of the first field effect transistor to a source/drain of the second field effect transistor, the conducting region having a lower resistance than at least one of the source/drain regions.

Still other embodiments relate to a semiconductor device including first and second memory cell means for storing data, the first and second memory cell means including source/drain regions. The device also includes connecting means for electrically connecting the first and second memory cell means, the connecting means having a resistance lower than that of the source/drain regions.

BRIEF DESCRIPTION OF THE DRAWINGS

Certain embodiments of the invention are described with reference to the accompanying drawings which, for illustrative purposes, are schematic and not necessarily drawn to scale.

DETAILED DESCRIPTION

Figure 1:
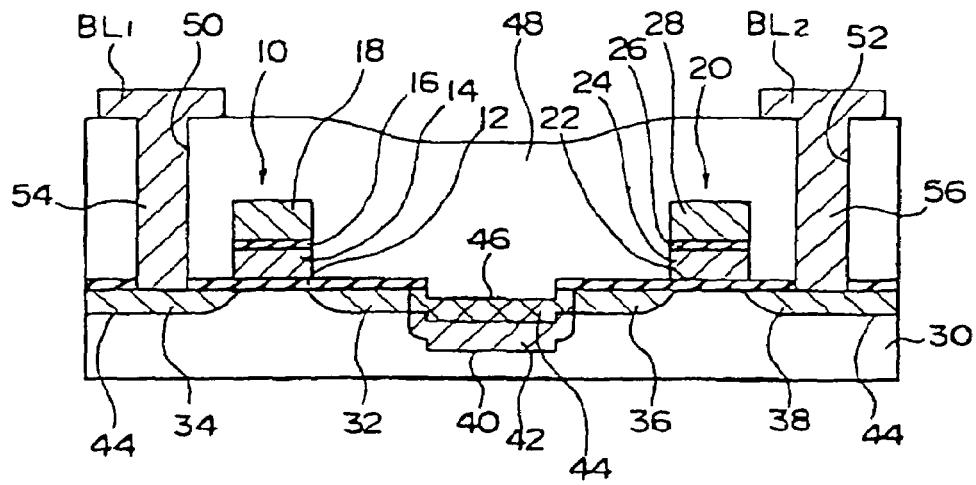
FIG. 1 is a view illustrating a semiconductor device made according to a first embodiment of the present invention.

Certain embodiments of the present invention provide a semiconductor device capable of preventing a retardation of signal transmission between the smallest units, a method of manufacturing such a semiconductor device, a circuit substrate and an electronic device.

A method of manufacturing a semiconductor device according to certain embodiments of the present invention includes a laminating step of forming tunnel insulating films, floating gates, dielectric films and control gates on first and second cell areas which are formed mutually adjacent to each other on a semiconductor substrate; and several times of impurity area formation steps for forming sources and drains on the first and second cell areas, and forming an electric connection between one of the source and drain of the first cell area on one hand and one of the source and drain of the second cell area on the other, wherein a connecting area is formed having a lower electric resistance than impurity areas formed in one of the several times of impurity area formation steps.

With the use of certain embodiments of the present invention, since there is a low electric resistance of the connecting area connecting together the first and second cell areas, it is possible to prevent a retardation of signal transmission. Here, in order to reduce the electric resistance, there may be various methods which can be used to increase the concentration of an impurity in the connecting area, or to enlarge the connecting area.

According to certain embodiments, a groove is formed in the connecting area on the surface of the semiconductor device. When the groove is formed, although the shape of the connecting area will be deformed, the use of the present invention makes it possible to reduce the electric resistance.

In addition, according to certain embodiments, the laminating step may include a step of forming a first insulating film on the surface of the semiconductor substrate; and a step of forming a first electrically conductive film on the first insulating film, and etching the first electrically conductive film corresponding to the first and second cell areas, thereby partially exposing the first insulating film in a groove formation area. These embodiments may also include a step of forming a second insulating film on the exposed portions of the first insulating film and on the first electrically conductive film; a step of forming a second electrically conductive film on the second insulating film; a step of etching the second electrically conductive film corresponding to the control gates; a step of etching the second insulating film corresponding to the dielectric film, and etching, in the groove formation area, the first insulating film to partially expose the surface of the semiconductor substrate; a step of etching the first electrically conductive film corresponding to the floating gates, and etching the exposed portions of the surface of the semiconductor substrate so as to form the groove.

When the semiconductor device is manufactured with the use of the above steps, the groove is formed in the connecting area.

According to certain embodiments for manufacturing a semiconductor device, the several times of impurity area formation steps may comprise a step of injecting a first impurity into an area containing the connecting area, a step of injecting a second impurity into an area for the formation of source and drain of the first and second cell areas.

With the use of the above method, the injection of an impurity for forming the source and drain is carried out separately from the injection of an impurity for forming the connecting area. Therefore, it is possible to inject the impurities under optimum conditions, thus making it easy to reduce the electric resistance of the connecting area.

According to certain embodiments for manufacturing a semiconductor device, the first impurity may be injected with a patterned resist serving as a mask; and the second impurity may be injected with the control gates, the dielectric films and the floating gates serving as masks.

Since the first impurity is used to form the connecting area, it is preferred that the sources and drains should not be laid one upon another. For this reason, it is preferred that the first impurity is injected with a patterned resist serving as a mask. On the other hand, in certain preferred embodiments, since the second impurity is used to form the sources and drains, it is desired that the impurity should not form a continuous layer under the floating gate. For such a reason, what is desired is only to use as masks the floating gates and layers laminated above the floating gates, without a necessity of patterning the resist.

According to certain embodiments for manufacturing a semiconductor device, the first impurity may be injected from an end portion of an area right under the floating gate of the first cell area to a portion in front of an area right under the floating gate of the second cell area. According to other embodiments, the first impurity may be injected in an area away from an area right under the floating gates of the first and second cell areas. In addition, according to certain embodiments, the first impurity may be injected into an area containing an end portion of an area right under the floating gates of the first and second cell areas.

In another aspect of certain embodiments, a dosing amount of the first impurity may be higher than a dosing amount of the second impurity. In this way, the impurity concentration of the connecting area may be increased, thereby reducing the electric resistance.

In addition, according to certain embodiments, the first and second impurities may be injected with the use of an ion injection technique, and an energy for injecting the first impurity may be larger than an energy for injecting the second impurity. In this way, since the connecting area may be formed with a great depth, its cross sectional area will be increased, thereby reducing its electric resistance.

According to another aspect of certain embodiments, the step of injecting the first impurity may be carried out at the same time when carrying out the step of forming one of a source/drain area and an off-set area of MOS transistor forming a surrounding circuit of the first and second memory cell areas. In this way, it is possible to inject the first impurity at the same time when forming the surrounding circuit.

In addition, according to certain embodiments, the connecting area is formed close to one of the source and drain of the first cell area, and also close to one of the source and drain of the second area. In addition, the impurity area formation steps may comprise: a step of injecting the first impurity into a source and drain formation area of the first cell area and into the connecting area; and a step of injecting the second impurity into a source and drain formation area of the second cell area and into the connecting area.

With the use of the above method, the source and the drain of the first cell area may be formed by the first impurity, the source and the drain of the second cell area may be formed by the second impurity. Further, with the connecting area, since the first and the second impurities are repeatedly injected thereinto, its impurity concentration will be increased, thus reducing its electric resistance.

Certain embodiments also relate to a semiconductor device including: (1) tunnel insulating films, floating gates, dielectric films and control gates, all of which are laminated on the first and second cell areas on the semiconductor substrate; (2) sources and drains formed on the first and second cell areas; and (3) a connecting area capable of electrically connecting one of the source and drain of the first cell area with one of the source and drain of the second cell area, wherein the connecting area has an electric resistance which is lower than any one of the sources and drains of the first and second cell areas.

With the use of the above embodiment, since there is a low electric resistance of the connecting area connecting together the first and second cell areas, it is possible to prevent a retardation of signal transmission. Here, in order to reduce the electric resistance, there may be various constitutions which can be used to increase the concentration of an impurity in the connecting area, or to enlarge the connecting area.

In certain embodiments, the semiconductor device may include a groove formed in the connecting area on the surface of the semiconductor substrate. When the above groove is formed, although the shape of the connecting area will be deformed, the use of the present invention makes it possible to reduce the electric resistance.

In another aspect of certain embodiments of the semiconductor device, an impurity concentration of the connecting area may be the same as an impurity concentration of one of the sources and drains of the first and second cell areas, but may be higher than an impurity concentration of the other of the sources and drains of the first and second cell areas.

In another aspect of certain embodiments, the impurity concentration of the connecting area is higher than the impurity concentrations of all the sources and drains of the first and second cell areas.

In another aspect of certain embodiments of the semiconductor device, at least one part of the connecting area may have almost the same impurity depth and almost the same impurity concentration of one of a source/drain area and an off-set area of MOS transistor forming a surrounding circuit of the first and second memory cell areas.

A circuit substrate according to the present invention may be equipped with the above semiconductor device. In addition, an electronic device according to the present invention may include the above circuit substrate.

Several preferred embodiments of the present invention will be described below with reference to the accompanying drawings.

Figure 2:
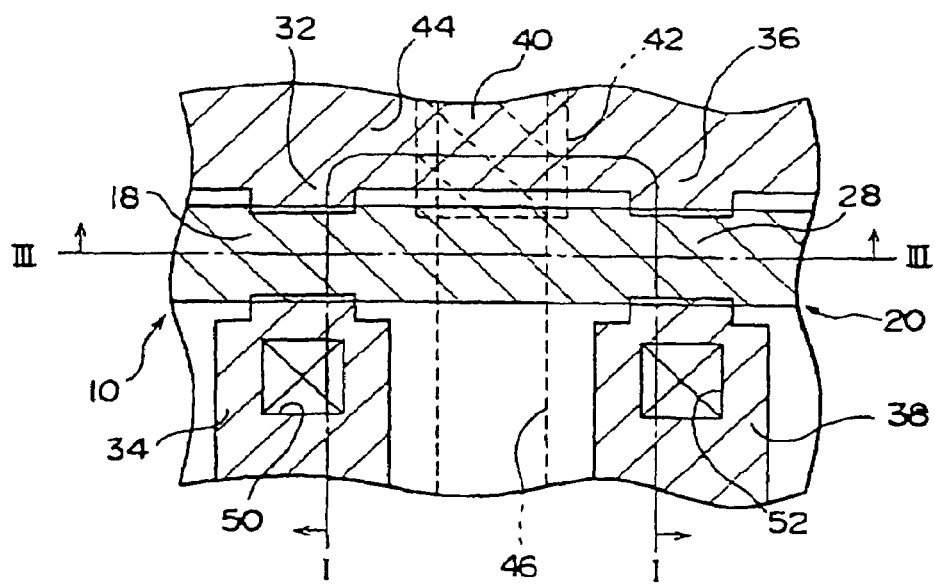
FIG. 2 is a view illustrating a semiconductor device made according to the first embodiment of the present invention.
Figure 3:
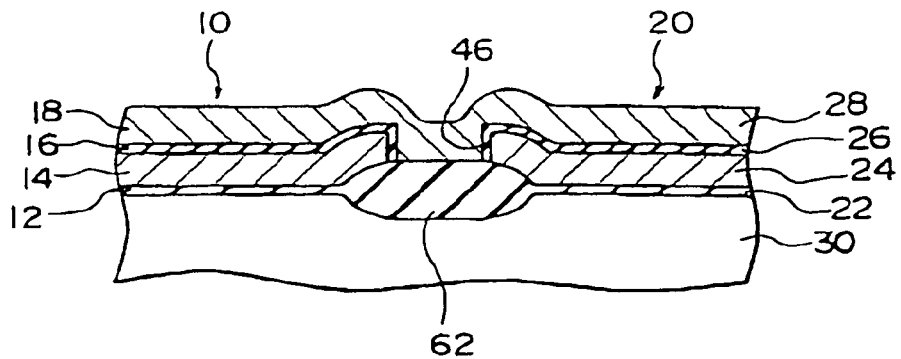
FIG. 3 is a view illustrating a semiconductor device made according to the first embodiment of the present invention.

FIGS. 1 to 3 are views illustrating a semiconductor device made according to a first embodiment of the present invention. FIG. 1 is a cross sectional view taken along line I—I shown in FIG. 2. FIG. 3 is also a cross sectional view taken along line III—III shown in FIG. 2.

The semiconductor device according to the embodiment of FIGS. 1–3 is an electrically writable memory (ROM: Read Only Memory) which is fabricated so that recorded data is electrically erasable. Alternatively, it is also possible to employ in certain embodiments of the present invention other types of structures such as an ultraviolet light erasing type of a ROM whose data can be erased by irradiation using an ultraviolet light, i.e., employ an EPROM (Electrically Programmable ROM). Such type of semiconductor device is a non-volatile semiconductor storing device. A smallest unit for storing information may be a memory cell, and a plurality of memory cells may be arranged to form a memory array. In this case, a plurality of memory cells are allowed to be arranged in a correct order, so as to form a plurality of rows and a plurality of columns. The following descriptions will be given only to a first memory cell and a second memory cell which are located adjacent to each other.

As shown in FIG. 1, the semiconductor device embodiment has a first memory cell area 10 and a second memory cell area 20. In the first memory cell area 10, there is provided a tunnel insulating film 12, a floating gate 14, a dielectric film 16 and a control gate 18, which are laminated or formed successively on a semiconductor substrate 30 in an order from below. In the second memory cell area 20, there is provided a tunnel insulating film 22, a floating gate 24, a dielectric film 26 and a control gate 28, which are laminated or formed successively on a semiconductor substrate 30 in an order from below.

As shown in FIG. 3, the control gates 18 and 28 are formed in a continuous manner and are electrically connected with each other. The floating gates 14 and 24 are separated from each other by an embedded insulating film 62, so that they are not electrically connected with each other. The embedded insulating film 62 may be formed using a LOCOS (Local Oxidation of Silicon) method.

The tunnel insulating films 12, 22 and the dielectric films 16, 26 are all electrically insulating films. When the tunnel films 12 and 22 are formed by an oxide film, they are referred to as tunnel oxide film. When the semiconductor substrate 30 is a silicon wafer, the tunnel films 12 and 22 may be formed by using a film of silicon oxide. Further, the dielectric films 16 and 26 may be formed by using an ONO film which is obtained by forming a film of silicon nitride between films of silicon oxide. The floating gates 14, 24 and the control gates 18, 28 are all electrically conductive films. Here, the electrically conductive film may be either a conductor or a semiconductor.

In the first memory cell area 10, there are formed one 32 and the other 34 of a source and a drain (hereinafter referred to as source/drain 32, 34). In more detail, the source/drain 32, 34 are formed in an area containing a plane in which the tunnel insulating film 12 of the semiconductor substrate 30 has been formed, or they are formed close to such a plane. Further, the source/drain 32, 34 are formed below the tunnel insulating film 12, located at positions having the floating gate 14 interposed therebetween. Also, the source/drain 32, 34 are formed extending to a part of an end portion of an area under the floating gate 14. The source/drain 32, 34 are separated from each other by the material of the semiconductor substrate 30.

In the second memory cell area 20, there are formed one 36 and the other 38 of a source and a drain (hereinafter referred to as source/drain 36, 38). In more detail, the source/drain 36, 38 are formed in an area containing a plane in which the tunnel insulating film 22 of the semiconductor substrate 30 has been formed, or they are formed close to such a plane. Further, the source/drain 36, 38 are formed below the tunnel insulating film 22, located at positions having the floating gate 24 interposed therebetween. Also, the source/drain 36, 38 are formed extending to a part of an end portion of an area under the floating gate 24. Nevertheless, the source/drain 36, 38 are separated from each other by virtue of the material of the semiconductor substrate 30.

Elements 32, 36 of the sources and the drains in the first and second memory cell areas 10, 20 are electrically connected each other by way of a connecting area 40. As illustrated in FIG. 1, the connecting area 40 is comprised of at least one portion of the first impurity area 42 and at least one portion of the second impurity area 44. In FIG. 1, there is indicated an example in which the entire area of the first impurity area 42 and a partial area of the second impurity area 44 are laid one upon another.

The second impurity area 44 is formed extending from an area containing an element 32 of the source and the drain in the first memory cell area 10, to an area containing an element 36 of the source and the drain in the second memory cell area 20. Further, the second impurity area 44 also contains one portion of the connecting area 40, which is formed between the elements 32, 36 of the sources and the drains in the first and second memory cell areas 10, 20.

As illustrated in FIG. 1, the first impurity area 42 is allowed to partially cover the second impurity area 44. At this time, in the mutually laminated area, since the impurity concentration will become high, an electrical resistance will become low. Further, the first impurity area 42 is also allowed to form in a position deeper than the second impurity area 44. At this moment, since the connecting area 40 is formed deeper than the elements 32, 36 of the sources and the drains, its cross section is large, so that its electric resistance is low. Alternatively, the impurity concentration of the first impurity area 42 is allowed to be higher than that of the second impurity area 44. In this case, the electric resistance of the connecting area 40 will become low.

At a position higher than at least one portion of the connecting area 40, there is formed a groove 46. Such groove 46 is located between the tunnel insulating films 12 and 22, and is formed on the surface of the semiconductor substrate 30. In practice, the groove 46 may be formed in a semiconductor device manufacturing process according to the present embodiment, and its details will be described below. Further, in the present embodiment, since the groove 46 is formed, a possible deformation of the connecting area 40 will not cause a reduced electric resistance owing to the above structure.

Namely, if an impurity area is formed on the surrounding area of the groove 46 at the same depth and with the same impurity concentration as at least one of the sources/drains 32, 34, 36, 38, the groove 46 will cause the impurity area to deform and can make its electrical resistance to become higher than that of any one of the sources/drains 32, 34, 36, 38. For this reason, in the present embodiment, at least one of the depth and the impurity concentration of the connecting area 40 should be made deeper or higher than at least any one of the sources/drains 32, 34, 36, 38, thereby inhibiting the electric resistance to a low value.

The above tunnel insulating films 12 and 22, the floating gates 14 and 24, the dielectric films 16 and 26, the control gates 18 and 28, are all covered by an interlayer insulating film 48. The interlayer insulating film 48 is an electrically insulating film which may be a film of silicon oxide or the like.

Above the elements 34, 38 of the sources and the drains in the first and second memory cell areas 10, 20, there are formed contact holes 50 and 52 passing through the tunnel insulating films 12, 22 and the interlayer insulating film 48. Thus, electrodes 54 and 56 are allowed to be electrically connected to the elements 34, 38 of the sources and the drains by way of the contact holes 50, 52. Further, a first and a second bit lines BL1 and BL2 are integrally formed with the electrodes 54 and 56.

Figure 4:
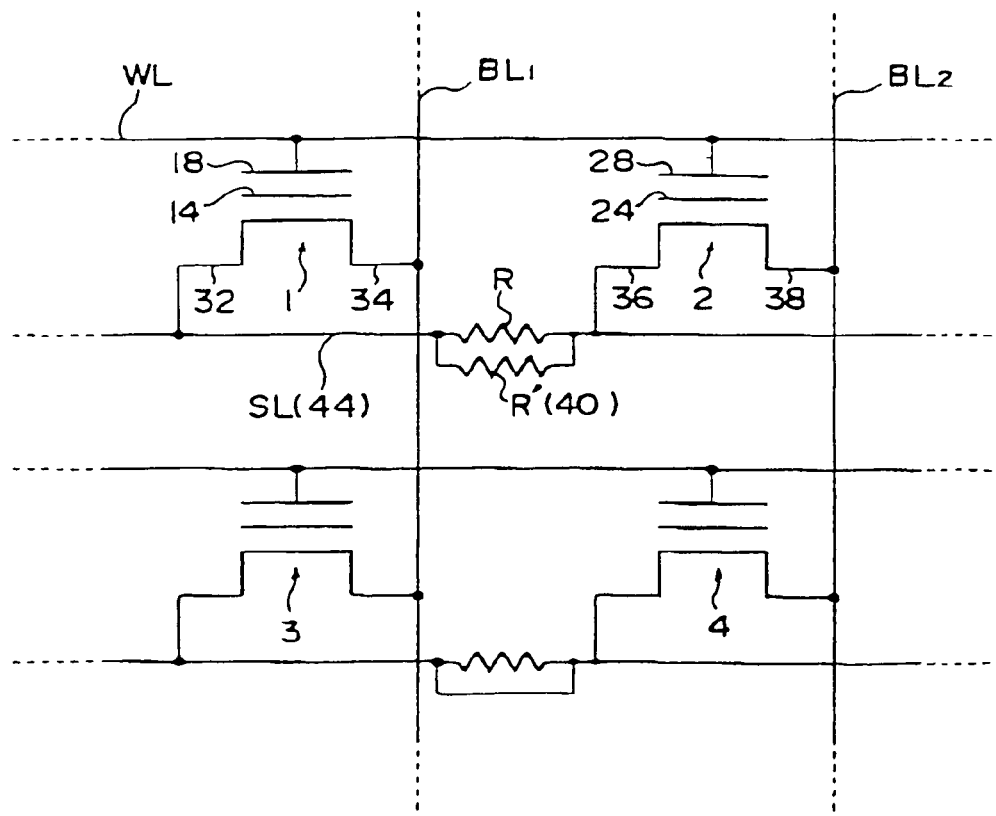
FIG. 4 is a view illustrating a circuit of a semiconductor device made according to the first embodiment of the present invention.

FIG. 4 is a view indicating some circuit portions of a semiconductor device made according to an embodiment to which the present invention has been applied. In the drawing, there are indicated a plurality of memory cells 1 to 4 forming a part of a memory array. Here, the memory cells 1, 2 may be deemed to be equivalent to the memory cell areas 10 and 20 shown in FIG. 1, so that identical portions will be indicated by the identical reference numerals. A description of the memory cells 1 and 2 is as follows.

The memory cells 1, 2 are connected to the bit lines BL1 and BL2 shown in FIG. 1, further connected to a word line WL. The word line WL is also connected to the control gates 18, 28 of the memory cells 1, 2. The source/drain 32, 36 of the memory cells 1, 2 are connected by virtue of a source line SL. However, the source/drain 32, 36 and the source line SL are formed by virtue of the second impurity area 44 shown in FIG. 1. Since the second impurity area 44 contains the groove 46, a resistance R may be formed in connection with the source line SL. Further, in an area containing the groove 46, since there is formed a connecting area 40 shown in FIG. 1, both ends of the resistance R may be directly connected with another resistance R' (R'<R). Therefore, it is possible to obtain a relatively low resistance as compared with the resistance R, thus preventing a retardation of signal transmission.

A semiconductor device formed according to the present embodiment, having the above constitution, will be described as to its operation in the following.

A write operation on the memory cells 1, 2 will be described as follows. At first, a high voltage VcH (for example 12 V) is applied to the control gates 18, 28 through the word line WL. Preferably, at the same time, another high voltage VcH (for example 5.5 V) is applied to those elements performing the write operation, which elements are among the source/drain (in this case, it relates only to drains) 34 and 38 of the memory cells 1, 2. Such high voltage VdH is applied through the bit lines BL1 and BL2. Preferably, at the same time, the source line SL is set at a low potential VsL (for example, an earth potential). At this moment, since there is provided a resistance R' (connecting area 40), it is possible to set the source line SL at a low potential, within a short time period.

In this way, among the source/drain 34 and 38, an electric current will flow from the elements having received the high voltage VdH along a direction of the source line SL. At this moment, electrons (which may also be called hot electrons)

are injected into the floating gates 14, 24 from the source line SL. As a result, a threshold voltage Vth of the transistor formed by the memory cells 1 and 2 will be higher than a standard voltage Vcc (for example, 5 V). If the threshold voltage Vth is not higher than the standard voltage Vcc, information will be written into the memory. On the other hand, if the threshold voltage Vth is lower than the standard voltage Vcc, information will not be written into the memory.

Next, a readout operation on the memory cells 1, 2 will be explained in the following. At first, a high voltage VcH (for example, 5 V) is applied to the control gates 18, 28 through the word line WL. At this time, a portion just effecting a write operation among the memory cells 1 and 2, has a higher threshold voltage Vth than the standard voltage Vcc, a transistor formed by the memory cells 1 and 2 will become OFF. On the other hand, a portion not effecting a write operation among the memory cells 1 and 2, has a lower threshold voltage Vth than the standard voltage Vcc, a transistor formed by the memory cells 1 and 2 will become ON. For instance, if source line SL, bit lines BL1 and BL2 are set at predetermined different potentials, and if electric current flowing through the bit lines BL1 and BL2 are detected, it is possible to detect the ON or OFF of the transistor, thereby detecting whether or not a write operation is being effected. Even at this time, since there is provided a resistance R' (connecting area 40), it is allowed to set the source line SL at a predetermined potential, within a short time period.

Next, an erase operation to be performed on the memory cells 1 and 2 will be described in the following. Namely, a high voltage VsH (for example, 5 V) is applied to the source line SL. Preferably, at the same time, at least a low voltage VcL (for example, −7 V) which is lower than a ground potential, is applied to the control gates 18, 28 through the word line WL. Preferably, at the same time, among the source/drain 34, 38 of the memory cells 1, 2, a portion just effecting an erase operation (in general, data on the entire area is erased) is maintained at a floating state (open) through the bit lines BL1 and BL2.

In this way, electrons will be drawn from the floating gates and caused to move in a direction along the source line SL. Then, since the threshold voltage Vth becomes lower than the standard voltage Vcc, the area will be changed to a state where no write operation is being conducted, thereby completing the erase operation.

Next, a method of manufacturing a semiconductor device according to the first embodiment of the present invention will be described in the following with reference to FIGS. 5 to 12A.

Figure 5:
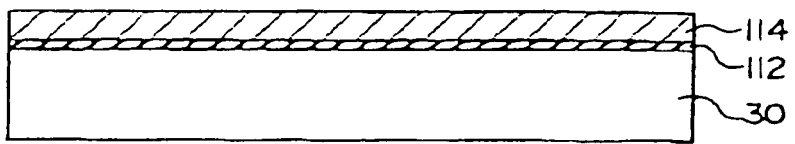
FIG. 5 is a view illustrating a method of manufacturing a semiconductor device according to the first embodiment of the present invention.

At first, as shown in FIG. 5, a first insulating film 112 is formed on the surface of the semiconductor substrate 30, followed by forming thereon an electrically conductive film 114. Here, a material forming the first insulating film 112 has an electrically insulating property. It is possible that the first insulating film 112 may be obtained by forming an oxide film on the surface of the semiconductor substrate 30 with the use of a method such as a thermal oxidizing method. If the semiconductor substrate 30 is formed by a silicon, the first insulating film 112 may be a film of silicon oxide. The thickness of the first insulating film 112 is preferred to be 7 to 10 nm. Further, the first insulating film 112 may be etched so as to become tunnel insulating films 12 and 22. When the first insulating film 112 is a film of silicon oxide, the tunnel insulating films 12 and 22 will be tunnel oxide films.

A material forming the first electrically conductive film 114 may contain not only an electrically conductive material but also a semiconductor such as silicon. In fact, it is possible that the first electrically conductive film 114 may be obtain by forming a silicon film on the first insulating film 112, with the use of a CVD method. Here, the thickness of the first electrically conductive film 114 is preferred to be 100 to 200 nm. The first electrically conductive film 114 may be etched so as to form the floating gates 14, 24.

Figure 6:
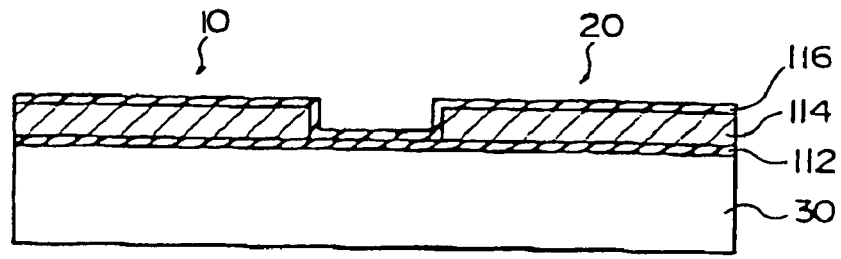
FIG. 6 is a view illustrating a method of manufacturing a semiconductor device according to the first embodiment of the present invention.

Next, as shown in FIG. 6, the first electrically conductive film 114 is selectively removed by means of an etching treatment which is conducted at or on an area in the vicinity of the first and second memory cell areas 10 and 20, and a second insulating film 116 is formed on the first electrically conductive film 114. In practice, the etching treatment performed on the first electrically conductive film 114 may be accomplished with the use of a technique such as photolithography. Further, the etching treatment utilized here is a selective etching treatment, and is used for etch-treating the first electrically conductive film 114, but under a condition in which the first insulating film 112 will not be etched.

The second insulating film 116 is formed on the remaining portions not etched during the etching treatment conducted on the first electrically conductive film 114, also on the first insulating film 112 exposed by partially etching the first electrically conductive film 114. The second insulating film 116 may be formed by laminating a silicon oxide film, a silicon nitride film, and a silicon oxide film. In such a case, the second insulating film 116 may be an ONO film. Here, the silicon oxide film may be formed with the use of either a CVD method or a thermal oxide film formation method. The silicon nitride film may be formed by a CVD method.

Figure 7:
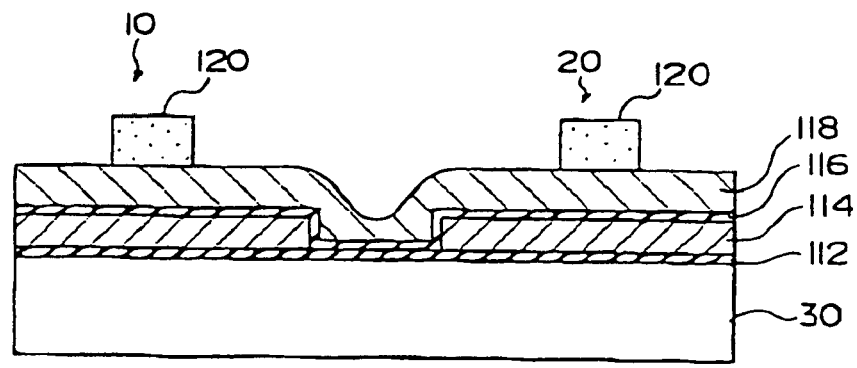
FIG. 7 is a view illustrating a method of manufacturing a semiconductor device according to the first embodiment of the present invention.

Next, as shown in FIG. 7, a second electrically conductive film 118 is formed on the second insulating film 116. A material forming the second electrically conductive film 118 may contain not only an electrically conductive material but also a semiconductor such as silicon. It is possible that the second electrically conductive film 118 may be obtained by forming a silicon film on the second insulating film 116, with the use of a method such as CVD method. Here, the thickness of the second electrically conductive film 118 is preferred to be about 200 to 400 nm. As another example serving as the second electrically conductive film 118, it is allowed to form a structure which includes a silicon film having a preferred thickness of 80 to 200 nm, and a silicide layer containing $WSi_2$, $MoSi_2$, $CoSi_2$, $TiSi_2$, etc., having a preferred thickness of 80 to 200 nm.

Then, a patterned resist 120 may be formed on the second electrically conductive film 118. The resist 120 is patterned in a manner such that it can cover up the surface of the second electrically conductive film 118 in an area corresponding to the control gates 18 and 28.

Figure 8:
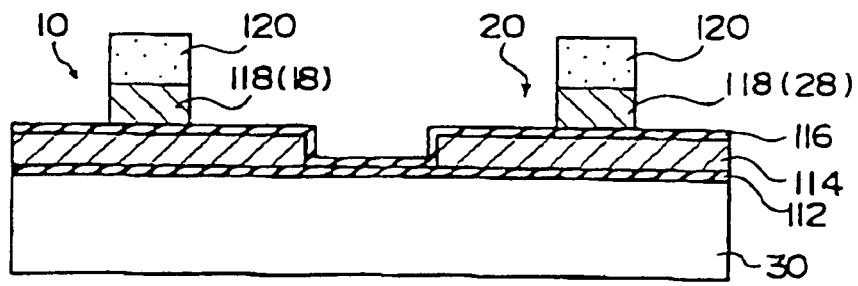
FIG. 8 is a view illustrating a method of manufacturing a semiconductor device according to the first embodiment of the present invention.

Next, the resist 120 is used as a mask and the second electrically conductive film 118 is selectively etched, thereby forming control gates 18, 28, as shown in FIG. 8. Here, an etching method used is a selective etching treatment, so that the second insulating film 116 will not be etched.

Figure 9:
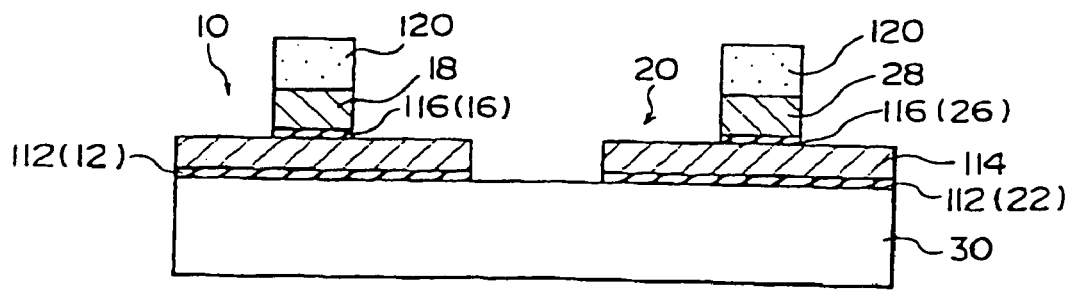
FIG. 9 is a view illustrating a method of manufacturing a semiconductor device according to the first embodiment of the present invention.

Subsequently, the resist 120 and the control gates 18 and 28 are used as masks to selectively etch the second insulating film 116. With the use of such an etching treatment, only the portions under the control gates 18 and 28 on the second insulating film 116 are allowed to remain, while other portions will be removed. As a result, as shown in FIG. 9, dielectric films 16 and 26 can thus be formed. Further, since the etching treatment will also remove the portions formed on the first insulating film 112 of the second insulating film 116, the first insulating film 112 can be partially exposed.

Such exposed portions will later become the first and the second memory cell areas 10 and 20.

The etching method suitable for use in the process is a selective etching method. However, in a case where the first insulating film 112 and the second insulating film 116 have the same properties, for example, when they are all oxide films, the second insulating film 116 together with the first insulating film 112 will be etched at the same time. Namely, the second insulating film 116 is removed so that the exposed portions of the first insulating film 112 will be etched. In this way, a portion of the surface of the semiconductor substrate 30 may be exposed between the first and the second memory cell areas 10 and 20. Further, the first insulating film 112 is etched, thereby forming the tunnel insulating films 12 and 22.

Figure 10:
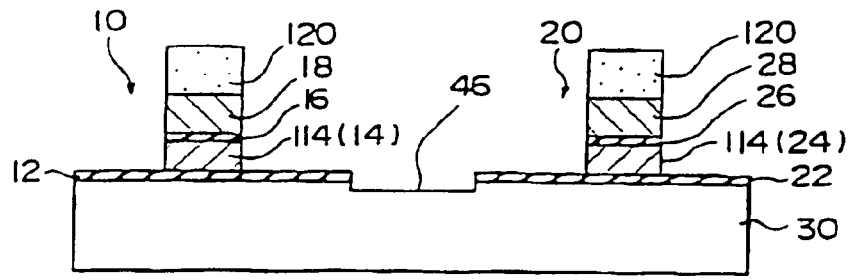
FIG. 10 is a view illustrating a method of manufacturing a semiconductor device according to the first embodiment of the present invention.

Next, the resist 120 and the control gates 18, 28 are used as masks to selectively etch the first electrically conductive film 114. With the use of the etching treatment, only the portions under the dielectric films 16, 26 on the first electrically conductive film 114 are allowed to remain, while other portions will be removed. As a result, as shown in FIG. 10, floating gates 14 and 24 will be formed.

An etching method suitable for use in the process is a selective etching method. However, in a case where the first electrically conductive film 114 and the semiconductor substrate 30 have the same properties, for example, when the first electrically conductive film 114 is formed by silicon, the first electrically conductive film 114 together with the semiconductor substrate 30 will be etched at the same time. Namely, as shown in FIG. 9, a portion exposed between the first and the second memory cell areas 10 and 20 on the surface of the semiconductor substrate 30, will be etched. In this way, a groove 46 can be formed on the surface of the semiconductor substrate 30 between the first and the second memory cell areas 10 and 20. However, it is also possible that the depth of the groove 46 may be made to be about 100 to 300 nm.

Figure 11:
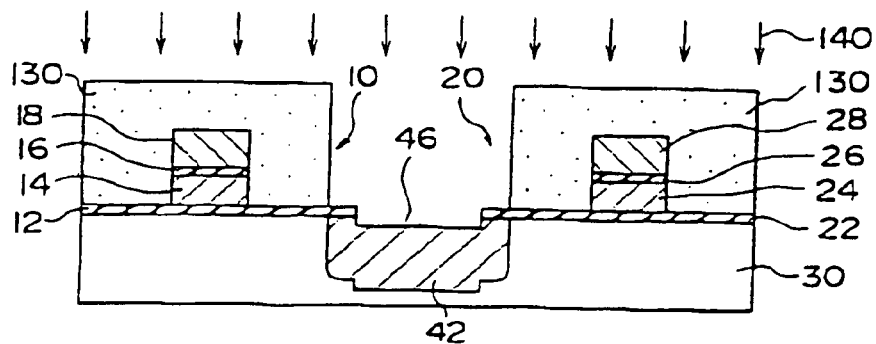
FIG. 11 is a view illustrating a method of manufacturing a semiconductor device according to the first embodiment of the present invention.

Next, the resist 120 is removed, and then, as shown in FIG. 11, another resist 130 having another pattern is formed thereon. The resist 130 should preferably be formed at least away from the groove 46 which has been formed on the semiconductor substrate 30. Further, the resist 130 is preferred to be formed not only away from the groove 46 but also away from the surrounding areas. Thus, it is preferred that at least the groove 46 is exposed, while the areas other than the groove 46 are covered by the resist 130. It is even more preferred that the groove 46 and the surrounding areas near the groove 46 are exposed, while other areas further from the groove 46 are covered by the resist 130, as illustrated, for example, in FIG. 11.

The resist 130 is used as a mask, and a first impurity 140 is injected on to the surface of the semiconductor substrate 30. For example, with the use of an ion injection technique, it is preferred to inject phosphorus ions with an energy of 40 to 120 keV and a preferred dosing amount of $1\times10^{14}$ to $6\times10^{15}$/cm². Alternatively, either phosphorus ions or arsenic ions are injected with a preferred energy of 30 to 80 keV and a dosing amount of $1\times10^{15}$ to $6\times10^{15}$/cm². Further, alternatively, both of the above phosphorus ions and arsenic ions are injected under the above conditions. The above ions may serve as an example of the first impurity 140. After injection of the first impurity 140, an annealing treatment may be conducted so as to form the first impurity area 42. The first impurity area 42 is, for example, an $N^+$ type area. It is possible that the depth of the first impurity area 42 may be about 200 to 600 nm, the impurity concentration thereof may be about $1\times10^{18}$ to $1\times10^{21}$/cm³. The preferred conditions for performing an annealing treatment for the first impurity area 42 involve an atmosphere of $N_2$ or $N_2/O_2$, a treating temperature of about 900 to 950° C., and a treating time of about 30 to 180 minutes.

Figure 12A:
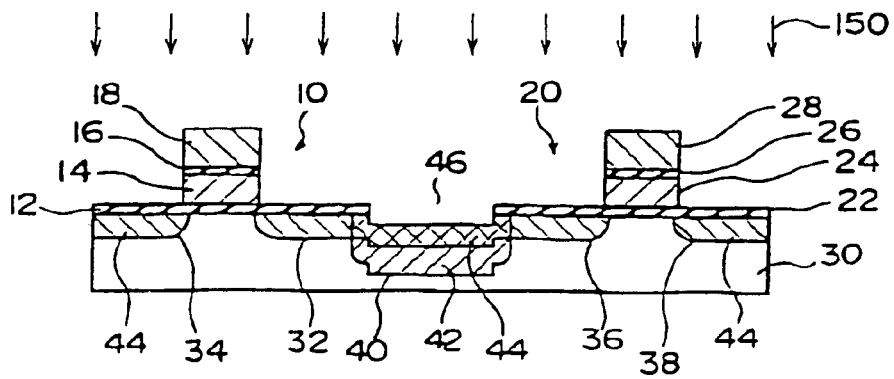
FIG. 12A is a view illustrating a method of manufacturing a semiconductor device according to the first embodiment of the present invention.

Next, the resist 130 is removed, and as shown in FIG. 12A, the floating gates 14 and 24 are used as masks so that the second impurity 150 is injected on to the surface of the semiconductor substrate 30. For example, with the use of an ion injection technique, it is preferred to inject phosphorus ions with an energy of 40 to 120 keV and a preferred dosing amount of $5\times10^{12}$ to $5\times10^{14}$/cm². Alternatively, either phosphorus ions or arsenic ions are injected with an energy of 30 to 80 keV and a dosing amount of $1\times10^{15}$ to $6\times10^{15}$/cm². Further, alternatively, both of the above phosphorus ions and arsenic ions are injected under the above conditions. The above ions may serve as an example of the second impurity 150.

Although the floating gates 14 and 24 can serve as masks, the second impurity 150 can also get into the end portions under the floating gates 14 and 24. After injection of the impurity 150, an annealing treatment may be conducted for the second impurity area 44. The second impurity area 44 is, for example, an $N^+$ type area. It is possible that the depth of the second impurity area 44 may preferably be about 100 to 400 nm, the impurity concentration thereof may preferably be made $1\times10^{17}$ to $1\times10^{21}$/cm³.

The second impurity area 44 may be used to form the sources/drains 32, 34, 36, 38 of the first and the second memory cells 10, 20, and be connected with the source/drain 32, 34. However, since the second impurity area 44 is formed with a groove 46 on areas in connection with the source/drain 32 and 36, the areas surrounding the groove 46 will have a high electric resistance.

In the present embodiment, at least the areas directly under the groove 46, preferably, the areas under the groove 46 and its surrounding areas, contain the first impurity area 42 formed therein. Therefore, some deformed portions occurred due to the groove 46 on the second impurity area 44 may be compensated by the first impurity area 42. As a result, since the surrounding areas adjacent to the groove 46 are connected with one another by virtue of the first and the second impurity areas 42 and 44, it is possible that the electric resistance may be reduced. In this way, the connecting area 40 may be formed by virtue of at least a part of the first impurity area 42, and at least a part of the second impurity area 44. The electric resistance of the connecting area 40 will be lower than that of the deformed portions occurred due to the groove 46 of the second impurity area 44.

Here, if an energy for injecting the first impurity 140 is made larger than an energy for injecting the second impurity 150, it is possible that the first impurity area 42 may be made deeper than the second impurity area 44, as illustrated in FIG. 12A. In such a case, if the connecting area 40 is made deeper than the second impurity area 44, it is sure to reduce the electric resistance.

Further, if the dosing amount of the first impurity 140 is made larger than the dosing amount of the second impurity 150, since the impurity concentration of the first impurity area 42 will be increased, it is sure to reduce the electric resistance of the connecting area 40.

Figure 12B:
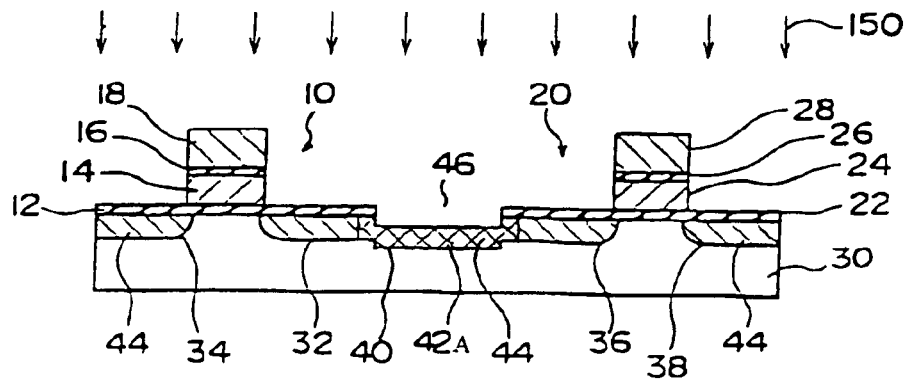
FIG. 12B is a view illustrating a method of manufacturing a semiconductor device according to an alternative embodiment of the present invention

Alternatively, it is also possible that a first impurity area 42A may be formed by being laid on the deformed portions occurred due to the groove 46 on the second impurity area 44, so that the first impurity area 42A and the second impurity area 44 overlap one another and extend about the same depth into the substrate 30, as illustrated in FIG. 12B.

In such a case, the impurity concentration of the deformed portions occurred due to the groove 46 on the second impurity area 44 will be increased, thereby reducing the electric resistance of the connecting area 40.

Afterwards, as shown in FIG. 1, an interlayer insulating film 48 may be formed on the entire surface of the semiconductor substrate 30, using a method such as CVD. The interlayer insulating film 48 may be formed by an oxide film such as a film of silicon oxide. Further, it is also possible that the interlayer insulating film 48 may be formed by, for example, a PSG (phosphosilicate glass) film, an SOG (spin-on glass) film or a BPSG (borophosphosilicate glass) film, each of which can be used to replace the film of the silicon oxide. Moreover, it is also possible that the interlayer insulating layer may be formed into a structure of a single one layer formed by using any one of the PSG film, the SOG film and the BPSG film. Alternatively, it is further possible that the interlayer insulating film may be formed into a multi-layer structure including a silicon oxide film, the PSG film, the SOG film and/or the BPSG film.

Subsequently, a patterned resist is used to selectively etch the interlayer insulating film 48 and the tunnel insulating films 12 and 22, thereby forming the contact holes 50 and 52 for partially exposing the source/drain 34, 38. Further, the electrodes 54 and 56 are formed within the contact holes 50 and 52, and the bit lines BL1 and BL2 are formed on the electrodes. Such kind of formation may be achieved by a well-known method.

With the use of the above process, a semiconductor device such as that shown in FIG. 1 may be obtained. With the use of such a semiconductor device, since there is a low electric resistance in the connecting area 40 for connecting together the first and second memory cell areas 10 and 20, it is possible to prevent a retardation of signal transmission.

Figure 13:
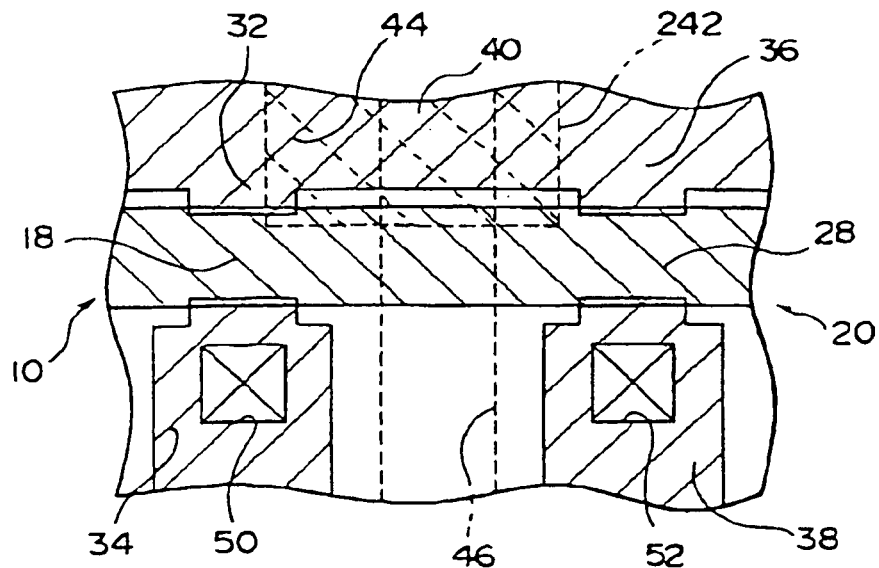
FIG. 13 is a view illustrating a semiconductor device made according to another embodiment of the present invention.

FIG. 13 is an explanatory view indicating a semiconductor device made according to another embodiment of the present invention. In this embodiment, a range for forming the first impurity area is different from the above first embodiment. Namely, a first impurity area 242 shown in FIG. 13 is different from the first impurity area 42 shown in FIG. 2. Other portions are the same as those in the first embodiment and are represented by the same reference numerals. In the following, a description will be given to a method for manufacturing a semiconductor device such as that illustrated in FIG. 13.

Figure 14:
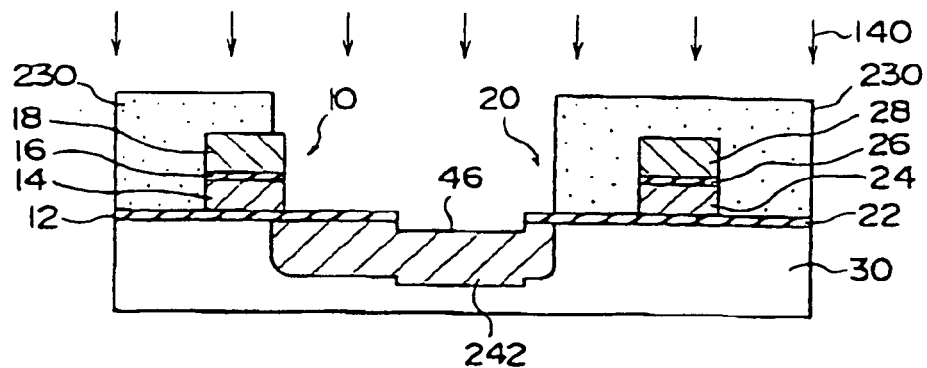
FIG. 14 is a view illustrating a method of manufacturing a semiconductor device as in FIG. 13 according to an embodiment of the present invention.

At first, the same processes as shown in FIGS. 5 to 10 indicating the first embodiment are carried out. Then, as shown in FIG. 14, a patterned resist 230 is formed. The resist 230 is formed away from the groove 46 or away from its surrounding area. Further, the resist 230 is formed on one of the first and second memory cell areas 10 and 20, away from at least a portion of the control gate 18, the dielectric film 16 and the floating gate 14. Namely, on one of the first and second memory cell areas 10 and 20, the resist 230 is so formed that the control gate 18, the dielectric film 16 and the floating gate 14 can be partially exposed. As seen in FIG. 14, the exposed portions are all facing the space between the first and second memory cell areas 10 and 20.

In this way, the patterned resist 230 is used as a mask so that the first impurity 140 may be injected thereinto. The conditions for injecting the impurity may be the same as injecting the first impurity 140 described in the above first embodiment.

The first impurity area 242 formed in this way, contains an area directly under the groove 46 or contains both the groove 46 and its surrounding areas. Therefore, the effects described in the above first embodiment may also be achieved in the present embodiment. Further, in the present embodiment, one end portion of the first impurity area 242 arrives at an area directly under the floating gate 14.

Next, a process such as that shown in FIG. 12A for the above first embodiment may be carried out, followed by one or more subsequent processes, thereby obtaining a semiconductor device. Such subsequent processes may include, but are not limited to, depositing an interlayer dielectric or insulating layer, opening via holes, forming interconnects, forming an upper wiring layer, and the like.

Figure 15:
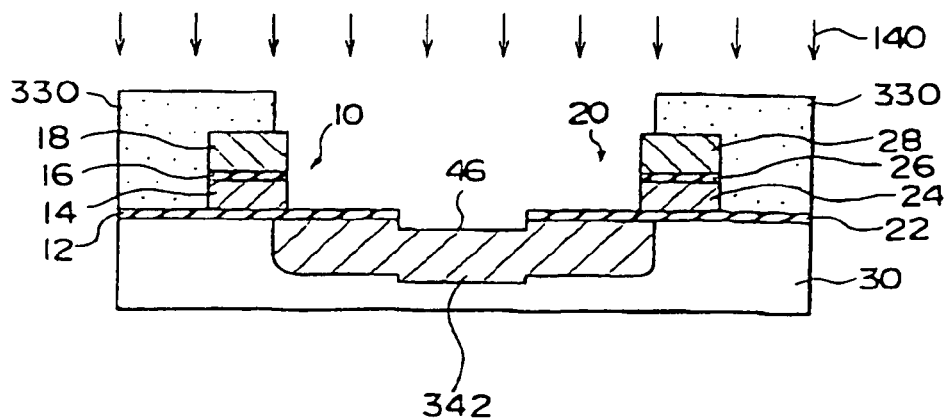
FIG. 15 is a view illustrating a method of manufacturing a semiconductor device according to still another embodiment of the present invention.

FIG. 15 is an explanatory view indicating a method for manufacturing a semiconductor device according to a still another embodiment of the present invention. In this embodiment, a range for forming the first impurity area is different from the above first embodiment. Namely, a first impurity area 342 shown in FIG. 15 is different from the first impurity area 42 shown in FIG. 2. Other portions are just the same as those in the first embodiment and are represented by the same reference numerals.

At first, processes such as those as shown in FIGS. 5 to 10 for the first embodiment are carried out. Then, as shown in FIG. 15, a patterned resist 330 is formed. The resist 330 is formed away from the groove 46 or away from both the groove 46 and its surrounding areas. Further, the resist 330 is formed on both the first and second memory cell areas 10 and 20, away from at least a part of the control gates 18, 28, the dielectric films 16, 26, and a part of the floating gates 14, 24. Namely, on both the first and second memory cell areas 10, 20, the resist 330 is so formed that the control gates 18, 28, the dielectric films 16, 26, and the floating gates 14, 24 can be partially exposed. As seen in FIG. 15, the exposed portions may include areas of the control gates 18, 28, the dielectric layers 16, 26, and the floating gates 14, 24 and the exposed portions generally face the space between the first and second memory cell areas 10 and 20.

In this way, the patterned resist 330 is used as a mask so that the first impurity 140 may be injected thereinto. The conditions for injecting the impurity may be the same as injecting the first impurity 140 described in the above first embodiment.

The first impurity area 342 formed in this way contains an area directly under the groove 46 or contains both the groove 46 and its surrounding areas. Therefore, the effects described in the above first embodiment may also be achieved in the present embodiment. Further, in the present embodiment, both end portions of the first impurity area 342 arrive at an area directly under the floating gates 14 and 24 of the first and second memory cell areas 10 and 20.

Next, a process such as that shown in FIG. 12A for the above first embodiment may be carried out, followed by one or more subsequent processes, such as those described earlier, thereby obtaining a semiconductor device.

Figure 16:
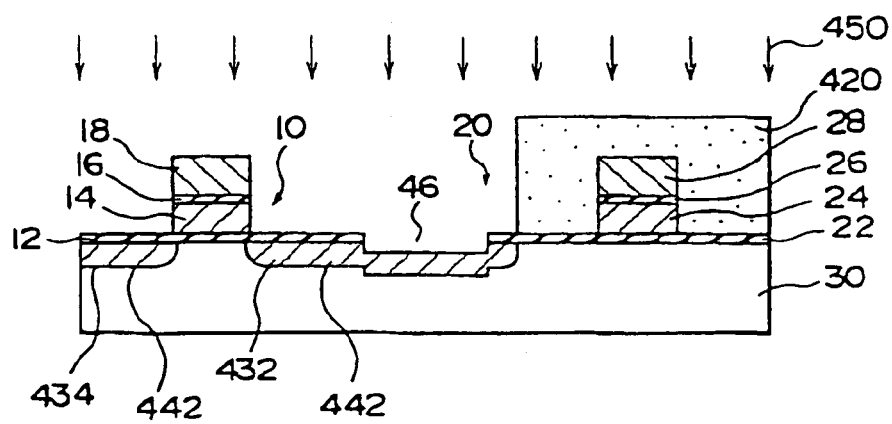
FIG. 16 is a view illustrating a method of manufacturing a semiconductor device according to an additional embodiment of the present invention.
Figure 17:
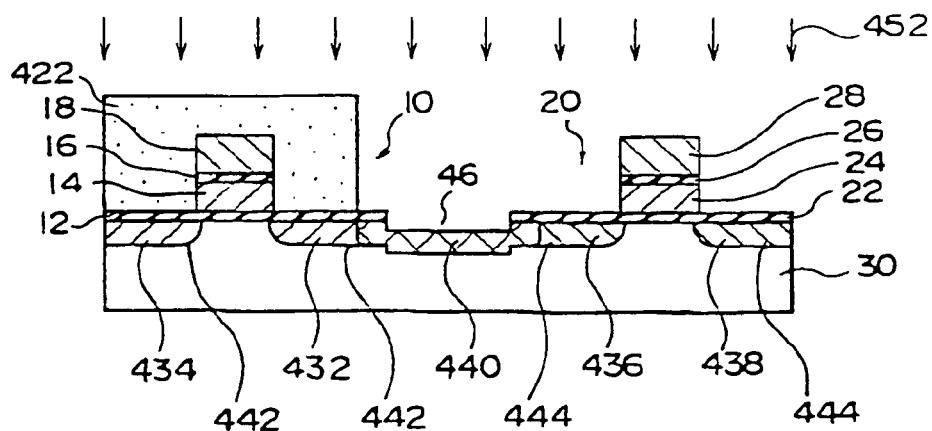
FIG. 17 is a view illustrating an additional step in a method of manufacturing a semiconductor device as in claim 16.

FIG. 16 and FIG. 17 are explanatory views indicating a method for manufacturing the semiconductor device according to an additional embodiment of the present invention. In the present embodiment, a range for forming the first and second impurity areas is different from the above first embodiment. The same features as those in the first embodiment are represented by the same reference numerals and thus explained.

At first, processes such as those as shown in FIGS. 5 to 10 are carried out. Then, as shown in FIG. 16, a patterned resist 420 is formed. The resist 420 is formed away from the groove 46 or away from both the groove 46 and its surrounding areas. Further, the resist 420 is formed away from one of the first and second memory cell areas 10, 20. Then, the resist 420 serves to cover the other of the first and second memory cell areas 10 and 20. Namely, the resist 420 is formed in a manner such that it is possible to expose the surface of one of the first and second memory cell areas 10 and 20, the surface of an area located between the first and second memory cell areas 10 and 20.

In this way, the patterned resist 420 is used as a mask so that the first impurity 450 may be injected thereinto. For example, it is possible to inject the first impurity 450 with the use of the conditions for injecting the second impurity 150 as described in the first embodiment.

The first impurity area 442 formed in this way, contains an area directly under the groove 46 or contains both the groove 46 and its surrounding areas. Further, the first impurity area 442 contains areas on both sides of the floating gate 14, on the side of one of the first and second memory cell areas 10 and 20, which side does not involve the resist 420. Moreover, the first impurity area 442 contains an end portion of an area located directly under the floating gate 14.

Portions on both sides of the floating gate 14 in the first impurity area 442 will become source and drain 432, 434.

Next, as shown in FIG. 17, the patterned resist 422 is formed. The resist 422 is formed away from the groove 46 or away from both the groove 46 and its surrounding areas. Further, the resist 422 is formed away from the other of the first and second memory cell areas 10 and 20. Then, one of the first and second memory cell areas 10 and 20 is covered by the resist 422. Namely, the resist 422 is formed in a manner such that it is possible to expose the surface of the other of the first and second memory cell areas 10 and 20, the surface of an area located between the first and second memory cell areas 10 and 20.

In this way, the patterned resist 422 is used as a mask so that the second impurity 452 may be injected thereinto. For example, it is possible to inject the second impurity 452 with the use of the conditions for injecting the second impurity 150 as described in the first embodiment.

The impurity area 444 formed in this way, contains an area directly under the groove 46 or contains both the groove 46 and its surrounding areas. Further, the first impurity area 444 contains areas on both sides of the floating gate 24, on the side of one of the first and second memory cell areas 10 and 20, which side does not involve the resist 422. Moreover, the second impurity area 444 contains an end portion of an area located directly under the floating gate 24.

Portions on both sides of the floating gate 24 in the first impurity area 444 will become source and drain 436, 438.

The above first and second impurity areas 442 and 444 may be repeatedly formed so as to obtain a connecting area 440, either in an area directly under the groove 46 or in an area including both the groove 46 and its surrounding areas. Although the connecting area 440 has been partially deformed due to the formation of the groove 46, since both the first and second impurities 450 and 452 have been injected therein, its impurity concentration will become high while its electric resistance will become low. Therefore, the effects described in the above first embodiment may also be achieved in the present embodiment.

Next, a process for forming the interlayer insulating film 48 such as that described in the above first embodiment may be carried out, followed by some subsequent processes, thereby obtaining a semiconductor device.

Figure 18:
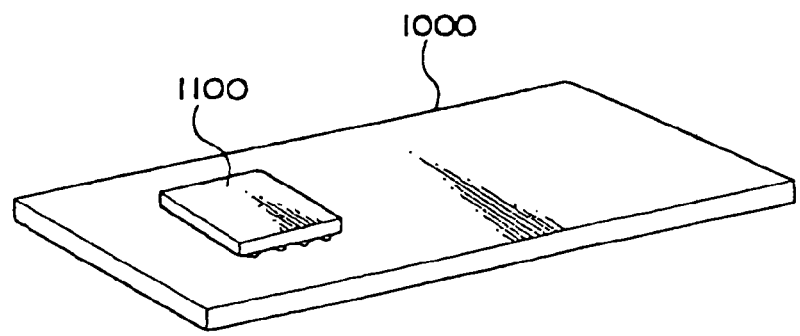
FIG. 18 is a view illustrating a circuit substrate equipped with a semiconductor device made according to an embodiment of the present invention.

In FIG. 18 there is illustrated a circuit substrate 1000 equipped with a semiconductor device 1100 manufactured using a method according to one of the above-described embodiments. In general, the circuit substrate 1000 may preferably be formed by using an organic substrate such as an glass epoxy substrate. In detail, preferred embodiments of the circuit substrate 1000 may be formed in a manner such that its bonding portion consisting of a conducting material such as, for example, copper, becomes a desired circuit. Furthermore, an electric conduction may be achieved by mechanically connecting together the bonding portions and the external electrodes of the semiconductor device 1100.

Figure 19:
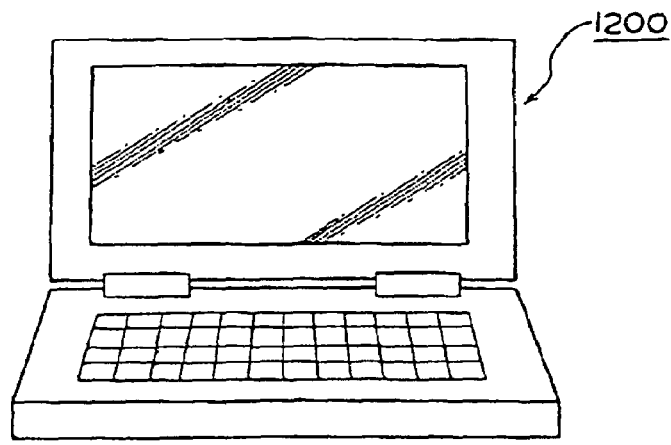
FIG. 19 is a view illustrating an electronic device having a circuit substrate equipped with a semiconductor device according to an embodiment of the present embodiment.

Then, as an electronic device equipped with the above circuit substrate 1000, there is illustrated in FIG. 19 a personal computer 1200 such as a notebook type.

The present invention should not be limited to the embodiments described in the above, but will allow various modifications. For example, the impurities 42, 242 and 342 shown in FIG. 1, FIG. 14 and FIG. 15 are preferred to be formed at the same time, with the same depth and the same concentration as those of a source/drain area or an off-set area of an MOS transistor forming a surrounding circuit of a memory cell. In particular, with respect to EPROM memory cell, when an off-set area of N channel MOS transistor of a surrounding circuit is formed, since the first impurity area of the memory cell will also be formed simultaneously, it is allowed to expect an improvement in characteristics of device, without having to carry out additional processes.

Figure 20:
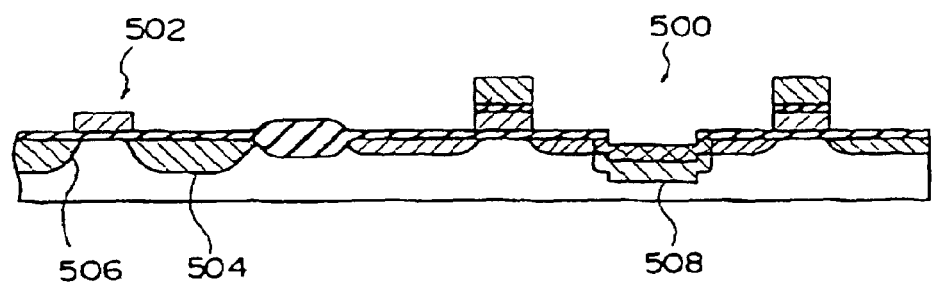
FIG. 20 is a view illustrating a modified example according to an embodiment of the present invention.
Figure 21:
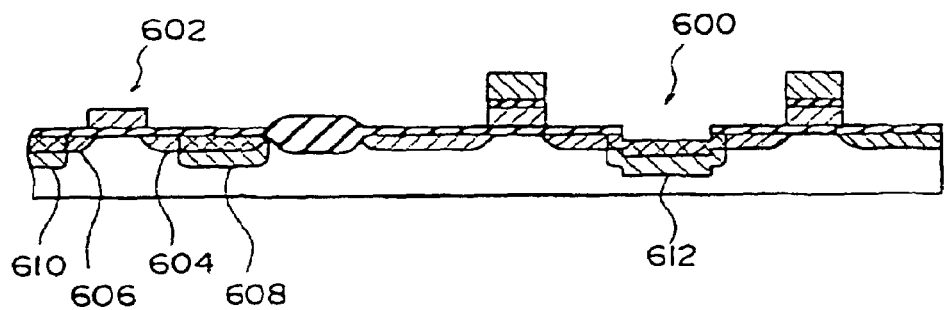
FIG. 21 is a view illustrating another modified example according to an embodiment of the present invention.

In an example shown in FIG. 20, a first impurity area 508 is formed with the same depth and in the same concentration as the source/drain areas 504, 506 of an MOS transistor 502 which is used to form a surrounding circuit of a memory cell 500. In an example shown in FIG. 21, source/drain areas 608, 610 of an MOS transistor 602 which is used to form a surrounding circuit of a memory cell 600, are formed with a plurality of impurity areas being laid one upon another, forming a first impurity area 612 in the same depth and with the same concentration as the off-set areas 604 and 606.

In addition, embodiments may also include a variety of other field effect transistor structures and methods for their manufacture.

What is claimed:

1. A method of manufacturing a semiconductor device, comprising:
   a laminating step including forming tunnel insulating films, floating gates, dielectric films and control gates on first and second cell areas, the first and second cell areas being formed mutually adjacent to each other on a semiconductor substrate; and
   a plurality of impurity area formation steps to form sources and drains on the first and second cell areas, and to form an electric connection between one of the source and drain of the first cell area and one of the source and drain of the second cell area;
   wherein a connecting area is formed to have a lower electric resistance than impurity areas formed in one of the plurality of impurity area formation step; and
   wherein a groove is formed in the semiconductor substrate in the connecting area, and wherein the plurality of impurity area formation steps to form an electric connection between one of the source and drain of the first cell area and one of the source and drain of the second cell area includes implanting impurities from the plurality of impurity area formation steps into the semiconductor substrate under the groove.

2. The method of manufacturing a semiconductor device according to claim 1, further comprising forming a dielectric layer in direct contact with an upper surface of the semiconductor substrate in the groove.

3. The method of manufacturing a semiconductor device according to claim 1, wherein the laminating step comprises:
   forming a first insulating film on the surface of the semiconductor substrate;
   forming a first electrically conductive film on the first insulating film, etching the first electrically conductive film corresponding to the first and second cell areas, thereby partially exposing the first insulating film in a groove formation area;

forming a second insulating film on the exposed portions of the first insulating film and on the first electrically conductive film;

forming a second electrically conductive film on the second insulating film;

etching the second electrically conductive film corresponding to the control gates;

etching the second insulating film corresponding to the dielectric film, and etching, in the groove formation area, the first insulating film to partially expose the surface of the semiconductor substrate; and etching the first electrically conductive film corresponding to the floating gates, and etching the exposed portions of the surface of the semiconductor substrate so as to form the groove.

4. The method of manufacturing a semiconductor device according to claim 1, wherein the plurality of impurity area formation steps comprises injecting a first impurity into an area containing the connecting area, and injecting a second impurity into an area for the formation of source and drain of the first and second cell areas; wherein the second impurity is also injected into the area containing the connecting area.

5. The method of manufacturing a semiconductor device according to claim 4, wherein the first impurity is injected with a patterned resist serving as a mask, and the second impurity is injected with the control gates, the dielectric films and the floating gates serving as masks.

6. The method of manufacturing a semiconductor device according to claim 4, wherein the first impurity is injected from an end portion of an area directly under the floating gate of the first cell area to a portion in front of an area directly under the floating gate of the second cell area.

7. The method of manufacturing a semiconductor device according to claim 4, wherein the first impurity is injected in an area away from an area directly under the floating gates of the first and second cell areas.

8. The method of manufacturing a semiconductor device according to claim 4, wherein the first impurity is injected into an area containing an end portion of an area directly under the floating gates of the first and second cell areas.

9. The method of manufacturing a semiconductor device according to claim 4, wherein a dosing amount of the first impurity is higher than a dosing amount of the second impurity.

10. The method of manufacturing a semiconductor device according to claim 4, wherein the first and second impurities are injected with the use of an ion injection technique, and an energy for injecting the first impurity is larger than an energy for injecting the second impurity.

11. The method of manufacturing a semiconductor device according to claim 4, wherein injecting the first impurity is carried out at the same time when forming one of a source/drain area and an off-set area of MOS transistor forming a surrounding circuit of the first and second memory cell areas.

12. The method of manufacturing a semiconductor device according to claim 1, wherein:

at least part of the connecting area is formed adjacent to one of the source and drain of the first cell area and one of the source and drain of the second area; and the plurality of the impurity area formation steps comprises:

injecting the first impurity into a source and drain formation area of the first cell area and into the connecting area; and injecting the second impurity into a source and drain formation area of the second cell area and into the connecting area.

13. A method for manufacturing a semiconductor device, comprising:

forming first and second field effect transistors on a substrate, each having source/drain regions;

forming a conducting region connecting a source/drain region of the first field effect transistor to a source/drain region of the second field effect transistor so that the conducting region has a lower resistance than at least one of the source/drain regions; and forming a groove between the first and second field effect transistors in the substrate, wherein the conducting region extends under the groove;

wherein the conducting region that extends under the groove is formed by exposing the region to first and second ion implantation operations, and wherein at least one of the source/drain regions is formed by exposing the region to only the second ion implantation operation.

14. The method of claim 13, wherein the second ion implantation operation is carried out after the first ion implantation operation.

15. The method of claim 13, wherein the first implantation operation is carried out using a higher energy than the second implantation operation.

16. The method of claim 13, wherein the conducting region has a lower resistance than any of the source/drain regions.

17. The method of claim 13, wherein first and second field effect transistors are each formed to include a floating gate.

18. The method of claim 13, further comprising forming a dielectric layer in direct contact with a surface of the substrate in the groove.

19. A method for manufacturing a semiconductor device comprising:

forming first and second field effect transistors each including a floating gate structure and source/drain regions in a semiconductor substrate;

forming a groove extending into the semiconductor substrate at a position between the first and second field effect transistors, wherein the floating gate structure of each of the first and second transistors is positioned a distance away from the groove; and forming a conducting region in the semiconductor substrate, the conducting region connecting a source/drain of the first field effect transistor to a source/drain of the second field effect transistor, the conducting region extending below the groove, the conducting region having a lower resistance than at least one of the source/drain regions, the conducting region being formed by a plurality of impurity implantation operations, wherein at least one of the multiple impurity implantation operations is also used to form the source/drain regions.

20. The method of claim 19, wherein the conducting region is formed to have a lower resistance than all of the source/drain regions.

21. The method of claim 19, further comprising forming a dielectric layer in direct contact with an upper surface of the semiconductor substrate in the groove.

* * * * *